(12) United States Patent  
Choi et al.

(10) Patent No.: US 8,743,608 B2  
(45) Date of Patent: Jun. 3, 2014

(54) NONVOLATILE MEMORY APPARATUS AND VERIFICATION METHOD THEREOF

(75) Inventors: Sung Dae Choi, Ichon-shi (KR); You Sung Kim, Ichon-shi (KR); Min Su Kim, Ichon-shi (JP)

(73) Assignee: SK Hynix Inc., Gyeonggi-do (KR)

( * ) Notice: Subject to any disclaimer, the term of this patent is extended or adjusted under 35 U.S.C. 154(b) by 179 days.

(21) Appl. No.: 13/412,892

(22) Filed: Mar. 6, 2012

(65) Prior Publication Data

US 2012/0275222 A1 Nov. 1, 2012

(30) Foreign Application Priority Data

Apr. 28, 2011 (KR) .................. 10-2011-0040148

(51) Int. Cl.  
*G11C 11/34* (2006.01)

(52) U.S. Cl.  
USPC .................................................. 365/185.09

(58) Field of Classification Search  
USPC .................................................. 365/185.09  
See application file for complete search history.

(56) References Cited

U.S. PATENT DOCUMENTS

2008/0174297 A1* 7/2008 Jang ........................ 324/76.11  
2012/0198180 A1* 8/2012 Kim et al. ..................... 711/154

FOREIGN PATENT DOCUMENTS

| KR | 1020060040064 A | 5/2006 |
| KR | 1020080069393 A | 7/2008 |
| KR | 1020100089508 A | 8/2010 |
| KR | 1020110085020 A | 7/2011 |

\* cited by examiner

*Primary Examiner* — Anthan Tran  
(74) *Attorney, Agent, or Firm* — William Park & Associates Patent Ltd.

(57) ABSTRACT

A nonvolatile memory apparatus includes: a memory cell array including a plurality of unit memory cells; a page buffer unit configured to read data from a selected memory cell of the memory cell array and store the read data; a controller configured to generate a reference current generation signal, a first current control signal, and a second current control signal, which correspond to the number of fail bits to be sensed and a deviation in cell current amounts flowing through the unit memory cells during a read operation, in response to a verification command; and a fail bit sensing unit configured to receive the reference current generation signal, the first current control signal, and the second current control signal from the controller in response to the verification command, and control at least one of a reference current amount and a data read current amount of the page buffer unit.

8 Claims, 4 Drawing Sheets

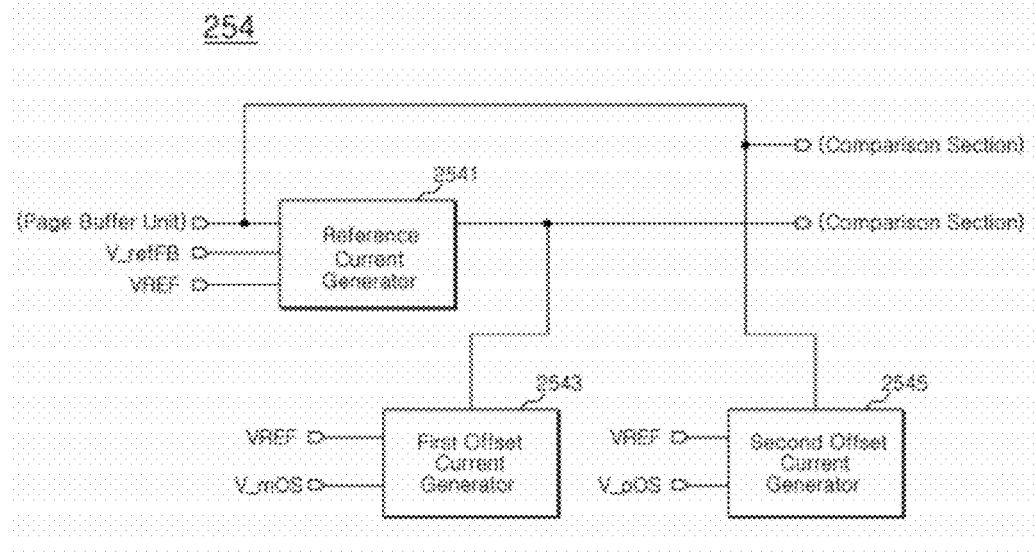

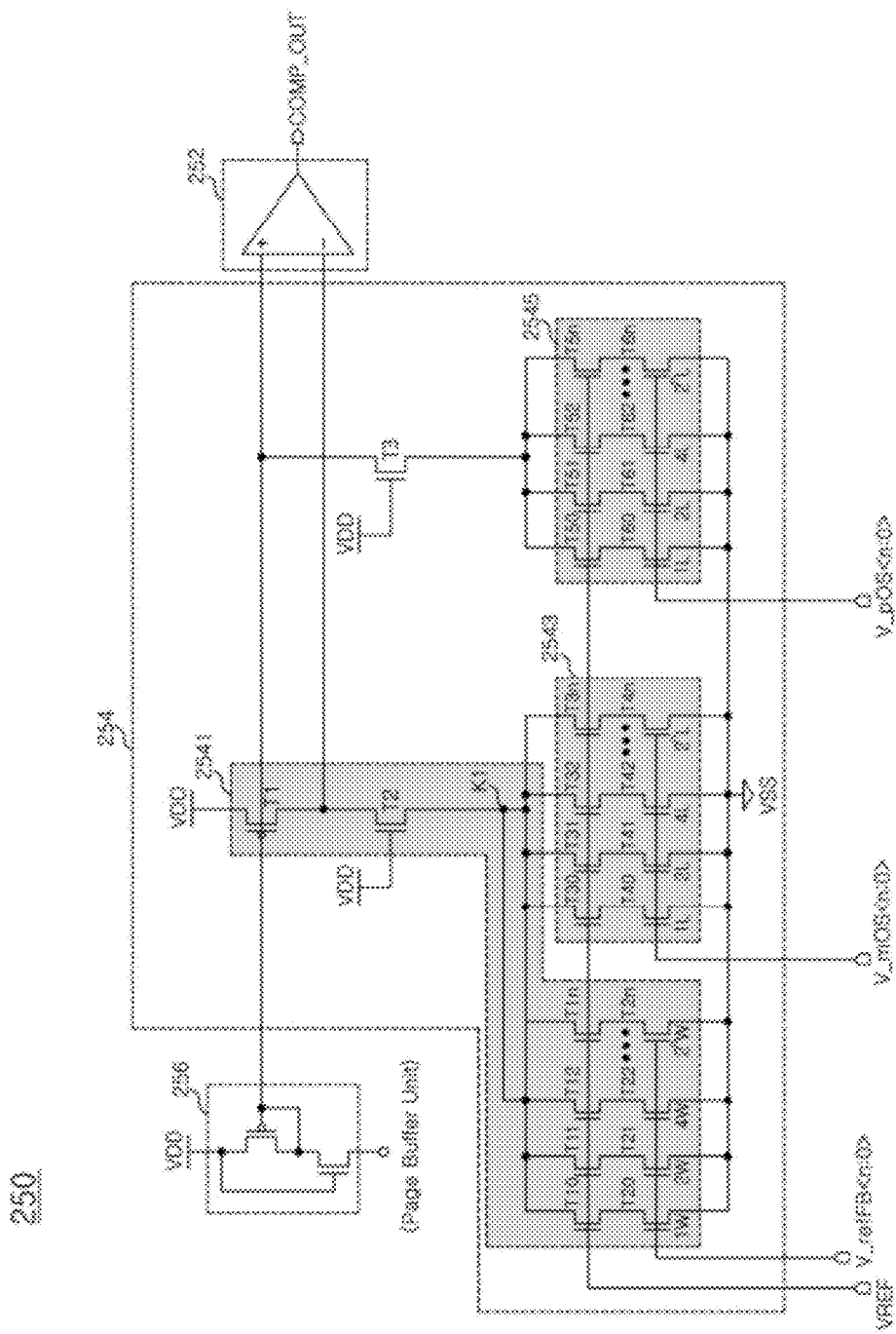

NONVOLATILE MEMORY APPARATUS AND VERIFICATION METHOD THEREOF

CROSS-REFERENCES TO RELATED APPLICATION

The present application claims priority under 35 U.S.C. §119(a) to Korean application number 10-2011-0040148, filed on Apr. 28, 2011, in the Korean Intellectual Property Office, which is incorporated herein by reference in its entirety as set forth in full.

BACKGROUND

1. Technical Field

The present invention relates to a semiconductor apparatus, and more particularly, to a nonvolatile memory apparatus and a verification method thereof.

2. Related Art

A nonvolatile memory apparatus, or particularly, a flash memory apparatus not only may be applied to a computer, a memory card and so on, but also the application field thereof has been expanded to a portable information device such as a wireless communication terminal and a digital camera.

In the flash memory apparatus, the level of data stored in each memory cell is defined by the threshold voltage of the memory cell, and thus a program operation may be referred to as a process of changing the threshold voltage of a memory cell.

In the flash memory apparatus, the program operation is generally performed according to an ISPP (Incremental Step Pulse Program) method.

When it is assumed that all memory cells which are to be programmed have the same program speed, the threshold voltages of the programmed memory cells after the program operation will have the same distribution as before the program operation.

However, the memory cells cannot have the same program speed, due to a variety of reasons occurring during the manufacturing process of the memory apparatus and a change of external condition depending on the use of the memory apparatus. Therefore, the program operation is performed by a method of increasing a program pulse, that is, the ISPP method.

That is, a first-step program pulse is applied to program the selected memory cells. Then, a verification voltage is applied to the selected memory cells to pass memory cells having a higher threshold voltage than the verification voltage. After that, the program voltage is increased by a constant step to apply a second-step program pulse to the memory cells having a threshold voltage equal to or lower than the verification voltage, and the program operation is then performed. Such a process is performed until all the memory cells are completely programmed. The memory cells passed at the previous program step are prohibited from being programmed, in order to substantially prevent over-programming.

As such, since the memory cells programmed at high speed and the memory cells programmed at low speed are mixed during the program operation, the program operation can be completed only when the memory cells programmed at low speed are completely programmed. Therefore, the program time is determined by a memory cell of which the program speed is the lowest.

However, when the number of memory cells which are not completely programmed, that is, the number of memory cells which are processed as fail cells during a verification process corresponds to such a level that can be recovered by an error correction algorithm, the program operation does not need to be performed until all the memory cells are programmed.

Therefore, a fail bit sensing unit is used to count the number of memory cells processed as fail cells during the verification process. Furthermore, when the counting result of the fail bit sensing unit corresponds to such a level that may be corrected, an error correction circuit of a controller performs an error correction on the corresponding cells such that the program operation is completed.

The fail bit sensing unit may be configured by using a current sensing circuit (CSC), and the configuration thereof will be described with reference to FIG. 1.

FIG. 1 is a diagram illustrating a conventional fail bit sensing unit 150.

The fail bit sensing unit 150 includes a CSC which is configured to compare current values read from the selected memory cells of the memory cell array 110 with a reference current and output a pass or fail decision. Here, the reference current is decided in correspondence to a bit number which can be corrected by the ECC.

That is, the fail bit sensing unit 150 determines a pass or fail according to whether a variation in current amounts of page buffers is allowable or not, during the verification operation after the program operation. The current amounts of the page buffers are changed by the number of memory cells which are not completely programmed, that is, the number of fail bits.

However, the amounts of current flowing in memory cells may have deviations, depending on the physical properties of the memory cells. Furthermore, when the sum of such deviations is equal to or larger than a cell current amount for one cell, an error may occur in counting the number of fail bits. For example, it may be assumed that the cell current amounts of all the memory cells have a deviation of +10% in comparison with an intended cell current amount. In this case, when 10 fail bits are to be counted, a current corresponding to 11 bits may be measured due to the deviations in current amount.

FIG. 2 is a diagram explaining an accumulative error according to the number of fail bits.

Referring to FIG. 2, when the magnitude of current flowing in one memory cell is assumed to be five, a deviation in cell current amounts does not have an effect upon the precision of fail bit sensing, in case where the number of fail bits is equal to or less than four.

However, as the number of fail bits increases, an error of the total current amount sensed by the fail bit sensing unit 150 gradually increases.

Such a deviation in cell current amounts may have an effect upon the current sensing operation of the fail bit sensing unit 150. In this case, even when it should be determined that the number of fail bits corresponds to such a level that can be corrected by the ECC, a fail signal may be outputted, and even when the number of fail bits does not correspond to such a level that can be corrected by the ECC, a pass signal may be outputted.

SUMMARY

In one embodiment of the present invention, a nonvolatile memory apparatus includes: a memory cell array including a plurality of unit memory cells coupled between a plurality of word lines and a plurality of bit lines; a page buffer unit configured to read data from a selected memory cell of the memory cell array and store the read data; a controller configured to generate a reference current generation signal, a first current control signal, and a second current control signal, which correspond to the number of fail bits to be sensed and a deviation in cell current amounts flowing through the unit memory cells during a read operation, in response to a verification command; and a fail bit sensing unit configured to receive the reference current generation signal, the first current control signal, and the second current control signal from the controller in response to the verification command, and control at least one of a reference current amount and a data read current amount of the page buffer unit.

In another embodiment of the present invention, a nonvolatile memory apparatus includes: a memory cell array including a plurality of unit memory cells, in which cell current amounts flowing in the unit memory cells have a negative deviation during a read operation; and a fail bit sensing unit configured to compare a read current amount flowing in a selected memory cell of the memory cell array with a reference current amount in response to a verification command. The fail bit sensing unit varies the reference current amount or the read current amount in correspondence to the number of fail bits to be sensed, when comparing the reference current amount with the read current amount.

In another embodiment of the present invention, a nonvolatile memory apparatus includes: a memory cell array including a plurality of unit memory cells, in which cell current amounts flowing in the unit memory cells have a positive deviation during a read operation; and a fail bit sensing unit configured to compare a read current amount flowing in a selected memory cell of the memory cell array with a reference current amount in response to a verification command. The fail bit sensing unit varies the reference current amount or the read current amount in correspondence to the number of fail bits to be sensed, when comparing the reference current amount with the read current amount.

In another embodiment of the present invention, there is provided a verification method of a nonvolatile memory apparatus including a controller, a memory cell array controlled by the controller, and a fail bit sensing unit. The verification method includes the steps of: receiving, by the fail bit sensing unit, a data read current from a selected memory cell of the memory cell array in response to a verification command; varying, by the fail bit sensing unit, a reference current or the read current according to the number of fail bits to be sensed, in correspondence to a deviation in cell current amounts flowing in the memory cells during a read operation; and comparing, by the fail bit sensing unit, the reference current with the read current and outputting a pass or fail.

BRIEF DESCRIPTION OF THE DRAWINGS

Features, aspects, and embodiments are described in conjunction with the attached drawings, in which:

FIG. 5 is a table showing data stored in a register of FIG. 4;

FIG. 6 is a diagram illustrating an offset control section of FIG. 3; and

FIG. 7 is a diagram illustrating a fail bit sensing unit of FIG. 3.

DETAILED DESCRIPTION

Hereinafter, a nonvolatile memory apparatus and a verification method thereof according to the present invention will be described below with reference to the accompanying drawings through exemplary embodiments.

Figure 1:
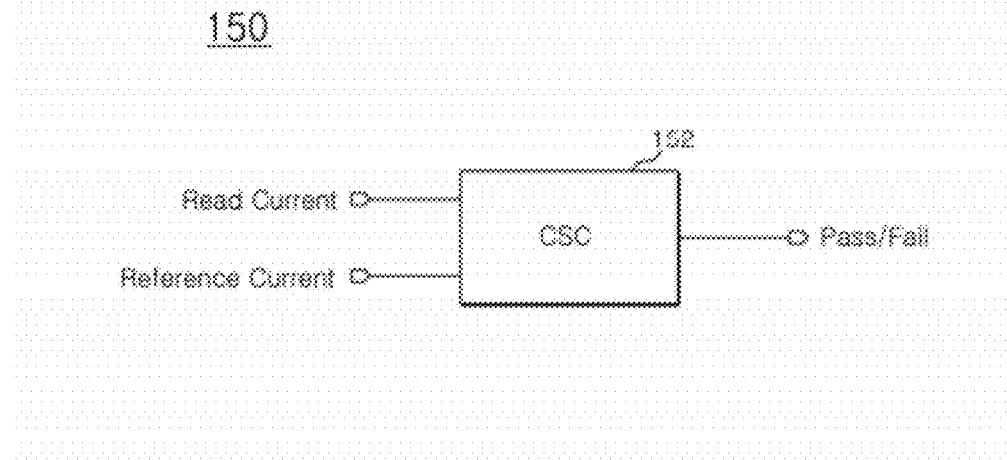
FIG. 1 is a configuration diagram of a conventional fail bit sensing unit.
Figure 2:
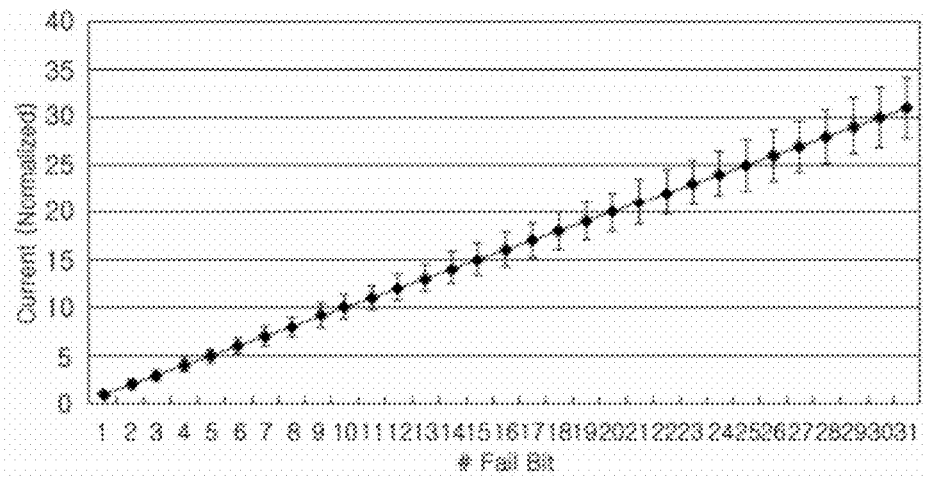
FIG. 2 is a diagram explaining an accumulative error according to the number of fail bits.
Figure 3:
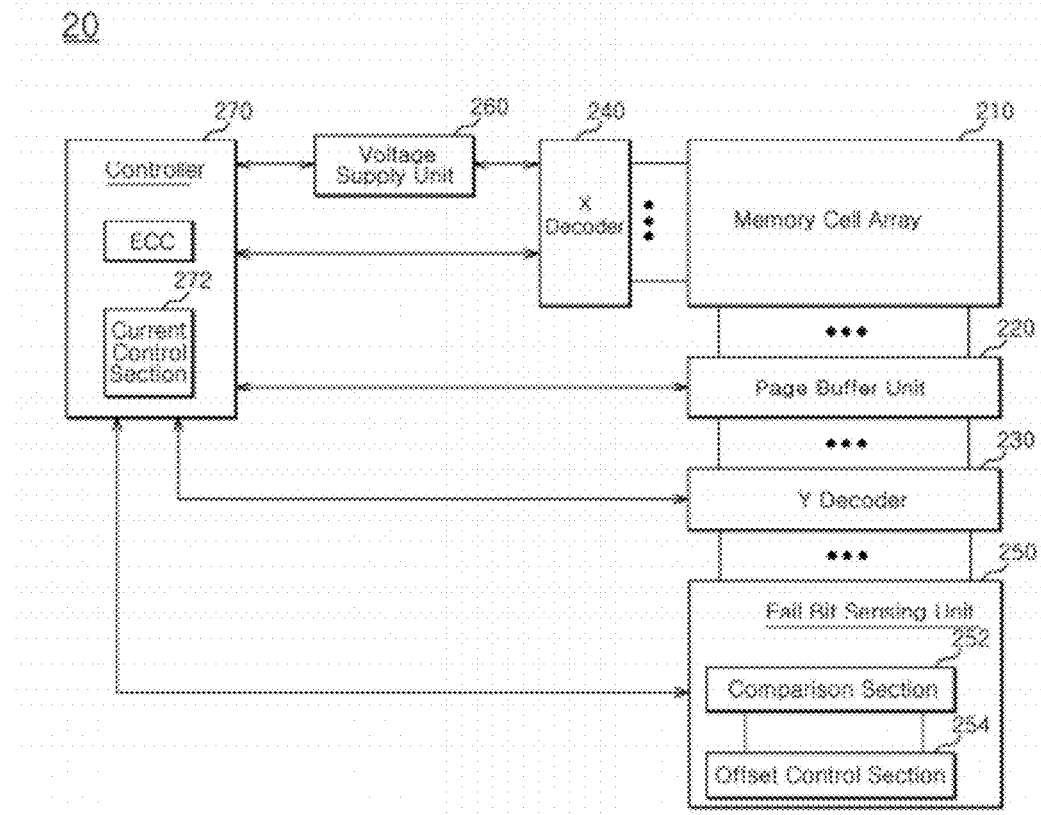
FIG. 3 is a configuration diagram of a nonvolatile memory apparatus according to one embodiment.

FIG. 3 is a configuration diagram of a nonvolatile memory apparatus according to one embodiment.

Referring to FIG. 3, the nonvolatile memory apparatus 20 includes a memory cell array 210, a page buffer unit 220, a Y decoder 230, an X decoder 240, a fail bit sensing unit 250, a voltage supply unit 260, and a controller 270 for controlling the entire operation.

The memory cell array 210 includes a plurality of memory cells configured to store data. The respective memory cells are coupled in a matrix shape between a plurality of word lines WL and a plurality of bit lines BL. A word line WL is configured to select and activate a memory cell, and a bit line BL is configured to input and output data of a memory cell. Furthermore, the memory cell array 210 may include one or more chips.

The page buffer unit 220 includes a plurality of page buffers coupled to the memory cell array 210 through the bit lines BL, and is configured to provide program data to a selected memory cell of the memory cell array 210, or read data from a selected memory cell of the memory cell array 210 and then store the read data.

The Y decoder 230 is configured to provide data input/output paths to the page buffers of the page buffer unit 220 according to the control of the controller 270, and the X decoder 240 is configured to select a word line WL of the memory cell array 210 according to the control of the controller 270.

The voltage supply unit 260 is configured to generate an operation voltage corresponding to an operation mode (program, erase, or read) according to the control of the controller 270, and supply the generated operation voltage to the word line WL or the page buffer unit 220 through the X decoder 240.

The fail bit sensing unit 250 is configured to count the number of memory cells which are not completely programmed, that is, the number of fail bits in response to a verification command. At this time, the fail bit sensing unit 250 receives a current control signal which is decided in correspondence to a deviation in cell current amounts from a current control section 272 of the controller 270, and changes a current amount read from the selected memory cells of the memory cell array 210 according to the current control signal, or changes a reference current amount and then compares the read current amount with the reference current amount to output a pass/fail decision. The reference current is decided within a bit number which can be corrected by an ECC. In particular, the number of memory cells to be sensed by the fail bit sensing unit 250 may be varied within the bit number which can be corrected by the ECC.

More specifically, the fail bit sensing unit 250 includes a comparison section 252 configured to compare the current amount read from the selected memory cells of the memory cell array 210 with the reference current amount and output a pass/fail decision. For example, the comparison section 252 may be configured by using a current sensing circuit (CSC).

The fail bit sensing unit 250 further includes an offset control section 254 configured to change the read current amount or the reference current amount according to the current control signal which is decided in correspondence to the deviation in cell current amounts. Here, the deviation in cell current amounts and a current change amount depending on the fail bit number to be sensed may be measured or decided through a test mode.

For example, when the deviation in cell current amounts has a positive (+) value, the offset control section 254 of the fail bit sensing unit 250 receives a minus offset signal as a first current control signal from the current control section 272 of the controller 270, and increases the reference current amount. Meanwhile, when the deviation in cell current amounts has a negative (−) value, the offset control section 254 receives a plus offset signal as a second current control signal from the current control section 272, and decreases the read current amount.

In another embodiment of the present invention, when the deviation in cell current amounts has a positive (+) value, the read current amount may be decreased according to the plus offset signal, and when the deviation in cell current amounts has a minus (−) value, the reference current amount may be decreased according to the minus offset signal.

For this operation, the current control section 272 stores the first current control signal (minus offset voltage) and the second current control signal (plus offset voltage) corresponding to the fail bit number to be sensed, according to the deviation in cell current amounts which is measured through a test mode. As the verification command is inputted, the current control section 272 provides the first and second current control signals to the offset control section 254.

The current control section 272 also provides a reference current generation signal to the offset control section 254. The reference current generation signal is decided according to the number of fail bits to be sensed. The reference current generation signal corresponding to the fail bit number may also be stored in the current control section 272.

As described above, the number of fail bits to be sensed by the fail bit sensing unit 250 may be varied within the bit number which can be corrected by the ECC. The number of fail bits to be sensed may include a fixed value or a value decided by a user.

Meanwhile, when a pass signal is outputted by the fail bit sensing unit 250, the ECC of the controller 270 performs an error correction operation on the corresponding memory cells, and the program operation is completed.

Figure 4:
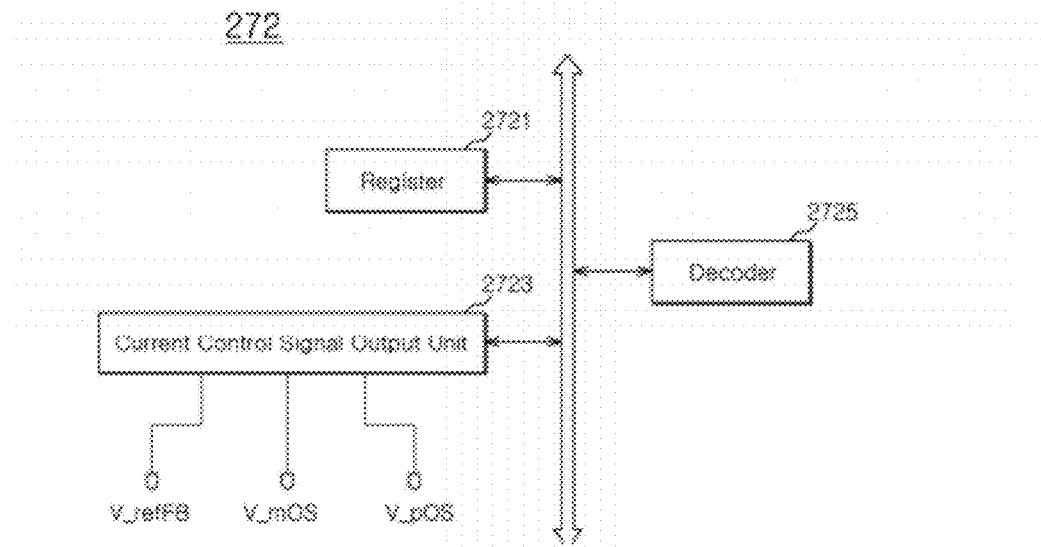
FIG. 4 is a diagram illustrating a current control section of FIG. 3.

FIG. 4 is a diagram illustrating the current control section of FIG. 3.

Referring to FIG. 4, the current control section 272 includes a register 2721 and a current control signal output unit 2723.

The register 2721 is configured to store control signals required for operating the fail bit sensing unit 250. That is, the register 2721 stores the first and second current control signals and the reference current generation signal for each sensing target fail bit number such that the offset control section 254 may change a current amount depending on the cell current amounts.

FIG. 5 is a table showing the data stored in the register of FIG. 4. Referring to FIG. 5, it can be seen that the data include a sensing target fail bit number, a reference current generation signal, a first current control signal as a minus offset voltage, and a second current control signal as a plus offset voltage, depending on the sensing target fail bit number.

FIG. 5 shows the reference current generation signal, the first current control signal, and the second current control signal when the sensing target fail bit number is set to 1, 2, 4, and 8, for example. The reference current generation signal, the first current control signal, and the second current control signal may be differently controlled according to a preset reference current and a cell-to-cell deviation. The detailed descriptions thereof will be described below with reference to FIG. 7.

The current control signal output unit 2723 is configured to select a reference current generation signal V_refFB, a first current control signal V_mOS, and a second current control signal V_pOS, which correspond to a sensing target fail bit number, by referring to the register 2721, and provide the selected signals to the offset control section 254, in response to a verification command.

The current control section 272 according to the embodiment may further include a decoder 2725. The decoder 2725 may decode the number of allowable fail bits to a designated bit number and then use the designated bit number as an address for accessing the register 2721.

For example, when a maximum number of 32 fail cells are to be sensed, the number of allowable fail bits may be decoded to a 5-bit binary number (00000~11111), and upper three bits of the decoding result may be designated as an address of the register 2721. As a result, the sensing target fail bit number stored in the register 2721 of FIG. 5 may be stored as the decoding result of the decoder 2725.

FIG. 6 is a diagram illustrating the offset control section of FIG. 3.

Referring to FIG. 6, the offset control section 254 includes a reference current generator 2541, a first offset current generator 2543, and a second offset current generator 2545.

The reference current generator 2541 is driven according to a current amount applied to an output terminal of the page buffer unit 220, and configured to receive a reference voltage VREF and the reference current generation signal V_refFB from the current control section 272 and generate a reference current.

The first offset current generator 2543 is configured to receive the reference voltage VREF and the first current control signal V_mOS from the current control section 272 and change the reference current amount.

The second offset current generator 2545 is configured to receive the reference voltage VREF and the second current control signal V_pOS from the current control section 272 and change the read current amount which is applied to an output terminal of the page buffer unit 220.

As a test result for the memory cell array 210, it is assumed that the cell current amounts of the respective memory cell have a negative (−) deviation. During a verification process after the program step, a read current amount of the fail bit sensing unit 250 will be sensed as a lower value than expected. This is because the cell current amounts have a negative deviation. Therefore, in this case, the reference current amount is decreased by the first current control signal such that the comparison section 252 precisely senses the number of fail bits. In another embodiment of the present invention, when the cell current amounts have a negative (−) deviation, the read current amount may be increased by the second current control signal.

Meanwhile, when the cell current amounts have a positive (+) deviation, the read current amount will be sensed as a higher value than expected, during the verification process. Therefore, in this case, the read current amount may be decreased by the second current control signal, or the reference current amount may be increased by the first current control signal such that the comparison section 252 precisely senses the number of fail bits.

FIG. 7 is a diagram illustrating the fail bit sensing unit of FIG. 3.

Referring to FIG. 7, the fail bit sensing unit 250 includes an input section 256, the comparison section 252, and the offset control section 254. The input section 256 is configured to provide a cell data read result from the page buffer unit 220 of FIG. 3. The comparison section 252 is configured to compare the read current amount by the input section 256 with the reference current amount and output a pass/fail signal COMP_OUT. The offset control section 254 is configured to vary the read current amount or the reference current amount in response to the reference voltage VREF, the reference generation signal V_refFB, the first current control signal V_mOS, and the second current control signal V_pOS which are provided from the current control section 272.

The comparison section 252 may include a current sensing circuit (CSC), but the configuration thereof is not limited thereto.

The offset control section 254 may include the reference current generator 2541, the first offset current generator 2543, and the second offset current generator 2545.

The reference current generator 2541 may include a first switching element T1, a second switching element T2, a third switching element group T10~T1$n$, and a fourth switching element group T20~T2$n$. The first switching element T1 is coupled to a power supply voltage terminal VDD and driven according to a voltage applied to an output terminal of the input section 256. The second switching element T2 is coupled between the first switching element T21 and a first node K1 and driven by the power supply voltage VDD. The third switching element group T10~T1$n$ is coupled in parallel to the first node K1 and driven by the reference voltage VREF. The fourth switching element group T20~T2$n$ is coupled in parallel between a ground terminal VSS and switching elements of the third switching element group T10~T1$n$ and driven by the reference current generation signal V_refFB<n:0>. The first switching element T1 may include a PMOS transistor, and the second switching element T2, the third and fourth switching element group T10~T1$n$ and group T20~T2$n$ may include NMOS transistors. However, the configuration is not limited thereto. Furthermore, the second switching element T2 may be omitted. In this case, the first offset current generator 2543 may be coupled to a drain terminal of the first switching element T1.

The respective switching elements included in the fourth switching element group T20~T2$n$ may have different channel widths w. For example, when the fourth switching element group T20~T2$n$ includes (n+1) switching elements driven in response to the reference current generation signal V_refFB<n:0> consisting of (n+1) bits, the channel width may be set to increase by $2^n$w (w is a unit channel width) from the switching element T20 driven by the least significant bit of the reference current generation signal V_refFB<n:0> to the switching element T2$n$ driven by the most significant bit of the reference current generation signal V_refFB<n:0>.

Therefore, the reference current amount may be changed according to which bit of the reference current generation signal V_refFB<n:0> has a logic high state. Referring to FIG. 5, when a reference current of 10 μA is set to flow per cell, the reference current may be set by changing the n-th bit of the reference current generation signal V_refFB<n:0> into a logic high state, in case where the sensing target fail bit is $2^n$ (n is a positive integer).

As such, the reference current generation signal V_refFB is decided by the controller 270 according to the number of fail bits to be sensed, and the reference current generator 2541 applies the reference current to the first node K1 in response to the reference voltage VREF and the reference current generation signal V_refFB.

The first offset current generator 2543 includes a fifth switching element group T30~T3$n$ and a sixth switching element group T40~T4$n$. The fifth switching element group T30~T3$n$ is coupled in parallel to the first node K1 and driven by the reference voltage VREF. The sixth switching element group T40~T4$n$ is coupled in parallel between the ground terminal VSS and switching elements forming the fifth switching element group T40~T4$n$, and driven by the first current control signal V_mOS. Here, the respective switching elements included in the fifth switching element group T30~T3$n$ and the sixth switching element group T40~T4$n$ may include NMOS transistors. However, the configuration is not limited thereto.

The sixth switching element group T40~T4$n$ is driven according to the first current signal V_mOS<n:0>, and varies the current amount of the first node K1, that is, the reference current amount. For this operation, the respective switching elements included in the sixth switching element group T40~T4$n$ may have different channel lengths L.

For example, when the sixth switching element group T40~T4$n$ includes (n+1) switching elements which are driven in response to the first current control signal V_mOS<n:0> consisting of (n+1) bits, the channel length may be set to increase by $2^n$L (L is a unit channel length) from the switching element T40 driven by the least significant bit of the first current control signal V_mOS<n:0> to the switching element T4$n$ driven by the most significant bit of the first current control signal V_mOS<n:0>.

Meanwhile, the second offset current generator 2545 includes an eighth switching element group T50~T5$n$ and a ninth switching element group T60~T6$n$. The eighth switching element group T50~T5$n$ is coupled in parallel to the output terminal of the input section 256 and driven by the reference voltage VREF. The ninth switching element group T60~T6$n$ is coupled in parallel between the ground terminal VSS and switching elements forming the eighth switching element group T50~T5$n$, and driven by the second current control signal V_pOS<n:0>. The second offset current generator 2545 may further include a seventh switching element T3 which is driven by the power supply voltage VDD to transmit a current amount applied to the output terminal of the input section 256. Here, the seventh switching element T3 and the respective switching elements of the eighth switching element group T50~T5$n$ and the ninth switching element group T60~T6$n$ may respectively include NMOS transistors. However, the configuration is not limited thereto.

The ninth switching element group T60~T6$n$ is driven by the second current control signal V_pOS<n:0> and varies a current amount applied to the output terminal of the input section 256, that is, the read current amount. For this operation, the respective switching elements included in the ninth switching element group T60~T6$n$ may have different channel lengths L.

For example, when the ninth switching element group T60~T6$n$ includes (n+1) switching elements which are driven in response to the second current control signal V_pOS<n:0> consisting of (n+1) bits, the channel length may be set to increase by $2^n$L (L is the unit channel length) from the switching element T60 driven by the least significant bit of the second current control signal V_pOS<n:0> to the switching element T6$n$ driven by the most significant bit of the first current control signal V_mOS<n:0>.

When the cell current amounts of the memory cells have a negative deviation, a read current amount will be measured as a lower value than expected. In this case, the deviation may be decreased by a method of reducing the reference current amount to be compared with the read current amount. Therefore, as the first current signal V_mOS is supplied in correspondence to the sensing target fail bit number, the reference current amount applied to the first node K1 is decreased. At this time, since the read current amount does not need to be changed, the ninth switching element T33 which is driven according to the second current control signal V_pOS may maintain a turn-off state. As another method, increasing the read current amount may be considered. In this case, as the second current signal V_pOS is supplied in correspondence to the sensing target fail bit number, it is possible to increase the read current amount.

Meanwhile, when the cell current amounts of the memory cells have a positive deviation, a read current amount is measured as a higher value than expected. Therefore, the ninth switching element T33 is turned on by the second current control signal V_pOS to decrease the read current amount. Since the reference current amount does not need to be changed, the sixth switching element T24 which is driven by the first current control signal V_mOS may maintain a turn-off state. As another method, increasing the reference current amount according to the first current control signal V_MOS may be considered.

When such an operation is performed, the reference current generation signal V_refFB and the first and second current control signals V_mOS and V_pOS are acquired from register 2721 in a state in which a result obtained by decoding the sensing target fail bit number through the decoder 2725 of the current control section 272 is set to an address, and then provided by the current control signal output unit 2723.

For easy understanding of the present invention, the following case will be described as an example.

A memory cell array in which a deviation in cell current amounts is +/−(1/N)(N is a natural number) for the cell current amounts is assumed as an example. In this case, when less than N memory cells are not completely programmed, it does not have an effect upon counting the number of fail bits, even though the deviation occurs.

However, when MN (M is a natural number) or more memory cells are not completely programmed, M memory cells may be counted more or counted less at every MN memory cells.

Therefore, when the deviation is +(1/N), a reference current generation signal is set in such a manner that the reference current becomes [cell current*(MN−1)], and the first current control signal V_mOS is set to a low level to turn off the second switching element T24. Furthermore, the second current control signal V_pOS may be set in such a manner that the ninth switching element T33 decreases a current corresponding to [cell current*(M−1)] from the read current amount.

Similarly, when the deviation is −(1/N), a reference current generation signal is set in such a manner that the reference current becomes [cell current*(MN−1)], and the first current control signal V_mOS is set in such a manner that the sixth switching element T24 decreases a current corresponding to [cell current*(M−1)] from the reference current amount. Furthermore, the second current control signal V_pOS may be set to a low level to turn off the ninth switching element T33.

In this embodiment, it has been described that, when the cell current amounts have a negative deviation, the reference current amount is decreased, and when the cell current amounts have a positive deviation, the read current amount is decreased. Without being limited thereto, however, when the cell current amounts have a negative deviation, the read current amount may be increased, and when the cell current amounts have a positive deviation, the reference current may be increased. In other words, any methods may be applied as long as they can compensate for a difference between the reference current amount and the read current amount by the cell deviation.

While certain embodiments have been described above, it will be understood to those skilled in the art that the embodiments described are by way of example only. Accordingly, the nonvolatile memory apparatus and the verification method described herein should not be limited based on the described embodiments. Rather, the nonvolatile memory apparatus and the verification method described herein should only be limited in light of the claims that follow when taken in conjunction with the above description and accompanying drawings.

What is claimed is:

1. A nonvolatile memory apparatus comprising:
    a memory cell array comprising a plurality of unit memory cells coupled between a plurality of word lines and a plurality of bit lines;
    a page buffer unit configured to read data from a selected memory cell of the memory cell array and store the read data;
    a controller configured to generate a reference current generation signal, a first current control signal, and a second current control signal, which correspond to the number of fail bits to be sensed and a deviation in cell current amounts flowing through the unit memory cells during a read operation, in response to a verification command; and
    a fail bit sensing unit configured to receive the reference current generation signal, the first current control signal, and the second current control signal from the controller in response to the verification command, and control at least one of a reference current amount and a data read current amount of the page buffer unit.

2. The nonvolatile memory apparatus according to claim 1, wherein the fail bit sensing unit controls the reference current amount according to the reference current generation signal and the first current control signal and decides a pass or fail.

3. The nonvolatile memory apparatus of claim 2, wherein the fail bit sensing unit controls the data read current amount of the page buffer unit according to the second current control signal and decides a pass or fail.

4. The nonvolatile memory apparatus according to claim 1, wherein the controller comprises:
    a register configured to generate the reference current generation signal, the first current control signal, and the second current control signal, which correspond to the number of fail bits to be sensed according to the deviation in cell current amounts; and
    a current control signal generator configured to provide the reference current generation signal, the first current control signal, and the second current control signal to the fail bit sensing unit.

5. The nonvolatile memory apparatus according to claim 4, wherein the controller further comprises a decoder configured to decode the number of fail bits to be sensed to binary bits in a designated unit.

6. The nonvolatile memory apparatus according to claim 4, wherein the controller further comprises an error correction circuit (ECC) configured to correct an error for fail bits, and the number of fail bits to be sensed is fixed or varied within such a range that is corrected by the ECC.

7. The nonvolatile memory apparatus according to claim 1, wherein the fail bit sensing unit comprises:
    a comparison section configured to compare the read current amount with the reference current amount to decide a pass or fail, in response to the verification command; and
    an offset control section configured to vary the reference current amount or the read current amount in response to the reference current generation signal, the first current control signal, and the second current control signal.

8. The nonvolatile memory apparatus according to claim 7, wherein the offset control section comprises:

a reference current generator configured to generate the reference current in response to the reference current generation signal provided from the controller;

a first offset current generator configured to vary the reference current amount in response to the first current control signal provided from the controller; and a second offset current generator configured to vary the read current amount in response to the second current control signal provided from the controller.

* * * * *